(12) United States Patent
Katamura et al.

(10) Patent No.: US 9,006,029 B2
(45) Date of Patent: Apr. 14, 2015

(54) METHOD FOR MANUFACTURING SEMICONDUCTOR DEVICES

(75) Inventors: Yukio Katamura, Mie-ken (JP); Yasuo Tane, Mie-ken (JP); Atsushi Yoshimura, Kanagawa-ken (JP); Fumihiro Iwami, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 305 days.

(21) Appl. No.: 13/052,144

(22) Filed: Mar. 21, 2011

(65) Prior Publication Data
US 2012/0052627 A1    Mar. 1, 2012

(30) Foreign Application Priority Data
Aug. 24, 2010    (JP) .................. 2010-187190

(51) Int. Cl.
| | | |
|---|---|---|
| H01L 21/00 | (2006.01) | |
| H01L 25/065 | (2006.01) | |
| H01L 21/56 | (2006.01) | |
| H01L 23/00 | (2006.01) | |
| H01L 25/00 | (2006.01) | |

(52) U.S. Cl.
CPC .......... *H01L 25/0657* (2013.01); *H01L 21/563* (2013.01); *H01L 24/06* (2013.01); *H01L 24/29* (2013.01); *H01L 24/83* (2013.01); *H01L 25/50* (2013.01); *H01L 24/27* (2013.01); *H01L 24/32* (2013.01); *H01L 24/48* (2013.01); *H01L 24/73* (2013.01); *H01L 24/92* (2013.01); *H01L 2224/06155* (2013.01); *H01L 2224/27312* (2013.01); *H01L 2224/27418* (2013.01); *H01L 2224/27848* (2013.01); *H01L 2224/29036* (2013.01); *H01L 2224/2919* (2013.01); *H01L 2224/32145* (2013.01); *H01L 2224/32225* (2013.01); *H01L 2224/73265* (2013.01); *H01L 2224/83051* (2013.01); *H01L 2224/92247* (2013.01); *H01L 2225/06562* (2013.01); *H01L 2924/01082* (2013.01); *H01L 2224/29* (2013.01); *H01L 2224/29298* (2013.01); *H01L 2924/01005* (2013.01); *H01L 2924/01006* (2013.01); *H01L 2924/01033* (2013.01);
(Continued)

(58) Field of Classification Search
CPC ......... H01L 24/06; H01L 24/27; H01L 24/29; H01L 24/32; H01L 24/48; H01L 24/73; H01L 24/83; H01L 24/92; H01L 25/50; H01L 25/0657; H01L 21/563
USPC .............. 438/106–127, FOR. 368, FOR. 369
See application file for complete search history.

(56) References Cited

U.S. PATENT DOCUMENTS

| | | | | |
|---|---|---|---|---|
| 5,231,147 A | * | 7/1993 | Hartman et al. .............. | 525/424 |
| 5,677,246 A | * | 10/1997 | Maeta et al. .................. | 438/118 |

(Continued)

FOREIGN PATENT DOCUMENTS

| | | |
|---|---|---|
| JP | 2008-288571 | 11/2008 |
| JP | 2009-111340 | 5/2009 |

*Primary Examiner* — Victor A Mandala
*Assistant Examiner* — Quovaunda V Jefferson
(74) *Attorney, Agent, or Firm* — Oblon, McClelland, Maier & Neustadt, L.L.P.

(57) ABSTRACT

According to one embodiment, a method is disclosed for manufacturing a semiconductor device including a semiconductor chip having electrode pads formed on a first major surface and a bonding layer provided on a second major surface, and a substrate having the semiconductor chip mounted on the substrate. The manufacturing method can include applying a fillet-forming material to a portion contacting an outer edge of the second major surface of the semiconductor chip on a front face of the substrate. The method can include bonding the second major surface of the semiconductor chip to the substrate via the bonding layer.

19 Claims, 7 Drawing Sheets

(52) U.S. Cl.
CPC ............... *H01L 2924/01074* (2013.01); *H01L 2924/0665* (2013.01); *H01L 2224/83191* (2013.01); *H01L 2224/48227* (2013.01); *H01L 2224/2929* (2013.01); *H01L 2924/00013* (2013.01)

(56) References Cited

U.S. PATENT DOCUMENTS

| | | | |
|---|---|---|---|
| 5,864,178 A * | 1/1999 | Yamada et al. | 257/737 |
| 6,265,776 B1 * | 7/2001 | Gilleo | 257/738 |
| 6,297,560 B1 * | 10/2001 | Capote et al. | 257/778 |
| 6,326,234 B1 * | 12/2001 | Nakamura | 438/106 |
| 6,353,263 B1 * | 3/2002 | Dotta et al. | 257/777 |
| 7,141,448 B2 * | 11/2006 | Ramalingam et al. | 438/64 |
| 2002/0105094 A1 * | 8/2002 | Sahara et al. | 257/778 |
| 2004/0140482 A1 * | 7/2004 | Kuwada et al. | 257/200 |
| 2004/0235996 A1 * | 11/2004 | Shah et al. | 524/366 |
| 2004/0251531 A1 * | 12/2004 | Yang et al. | 257/686 |
| 2005/0040529 A1 * | 2/2005 | Lee | 257/738 |
| 2005/0258528 A1 * | 11/2005 | Jensen et al. | 257/686 |
| 2009/0218671 A1 * | 9/2009 | Kuwabara | 257/686 |

\* cited by examiner

US 9,006,029 B2

METHOD FOR MANUFACTURING SEMICONDUCTOR DEVICES

CROSS-REFERENCE TO RELATED APPLICATIONS

This application is based upon and claims the benefit of priority from the prior Japanese Patent Application No. 2010-187190, filed on Aug. 24, 2010; the entire contents of which are incorporated herein by reference.

FIELD

Embodiments described herein relate generally to a method for manufacturing a semiconductor device.

BACKGROUND

Many semiconductor devices have a structure in which semiconductor chips are mounted on a circuit substrate, lead frame or the like, and then subjected to molding with sealing resin. This structure is simple and cheap to manufacture and is therefore widely used.

However, when gaps—so-called "sink marks"—are generated, for instance, between the circuit substrate and the semiconductor chip bonded to the substrate a semiconductor chip of a lower level may be damaged, leading to the degrading of the characteristics of the chip due to the Si, or the like, included in the resin entering the sink marks at formation of the resin seal. Moreover, when high pressure resin enters the sink holes as the sealing resin is formed, chip separation—so-called "opening" may also occur. Therefore, there is a need for a method for manufacturing a semiconductor wherein the formation of sink marks can be suppressed.

DETAILED DESCRIPTION

Figure 1A:
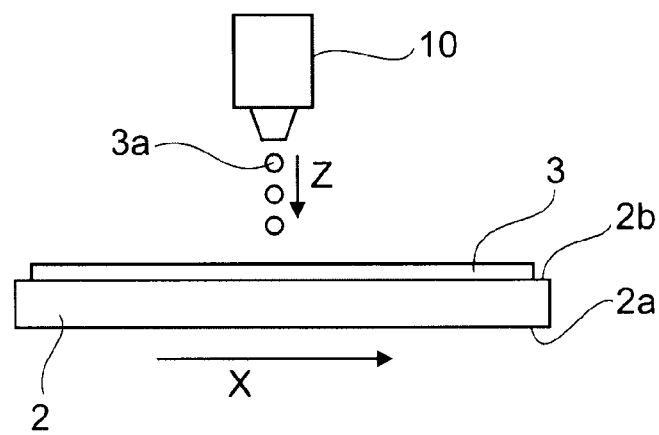
FIGS. 1A to 1D are schematic views illustrating a manufacturing process of a semiconductor chip according to a first embodiment.

In general, according to one embodiment, a method is disclosed for manufacturing a semiconductor device including a semiconductor chip having electrode pads formed on a first major surface. The manufacturing method can include forming a bonding layer provided on a second major surface of the semiconductor chip. The manufacturing method can include applying a fillet-forming material to a portion contacting an outer edge of the second major surface of the semiconductor chip on a front face of a substrate. The method can include bonding the second major surface of the semiconductor chip to the substrate via the bonding layer.

Various embodiments will now be described hereinafter with reference to the accompanying drawings. Note that in the following embodiments, the same numerals are applied to constituents that have already appeared in the drawings and, and repetitious detailed descriptions of such constituents are omitted. Differing constituents are described accordingly.

(First Embodiment)

FIGS. 1A to 1D are schematic views illustrating a manufacturing process of a semiconductor chip 5 according to the embodiment. FIG. 1A illustrates a process of applying a bonding agent 3a to a back face 2b of a semiconductor wafer 2 to form a bonding layer 3.

Methods for forming the bonding layer 3 by adhering the bonding agent 3a to the back face 2b of the semiconductor wafer 2 in a film state include, for instance, coating methods, ink-jet methods, spraying methods, mist-coating methods, roll coater methods, screen printing methods, jet dispensing methods, and squeegee methods.

In the embodiment, the formation of the bonding layer 3 using an ink-jet method is given as an example. With the ink-jet method, a thin film of uniform thickness can be formed without contact by adhering the bonding agent 3a to the back face 2b of the semiconductor wafer 2.

For example, as illustrated in FIG. 1A, the bonding agent 3a, which includes a resin and a solvent, is jetted from a jet portion 10 towards the back face 2b of the semiconductor wafer 2. The semiconductor wafer 2 is moved in an X direction perpendicular to a jetting direction Z of the bonding agent 3a. Accordingly, the bonding agent 3a can be adhered in a film state to the back face 2b of the semiconductor wafer 2 to form the bonding layer 3.

Next, the bonding agent 3a may be, for instance, heated to evaporate the solvent by mounting the semiconductor wafer 2 on a stage of a predetermined temperature. The heating temperature can be configured so as to be no less than 40° C. and not more than 120° C. If the bonding agent 3a includes a thermosetting resin, a so-called "B stage" bonding layer 3 can be formed.

Note also that while there is no limit on the thickness of the bonding agent 3a when adhering it in a film-state, the generation of uneven portions on the front face of the bonding layer 3 can be suppressed by keeping a single application thickness to not more than 1 µm. To thicken the bonding layer 3, layers can be added by repeated application and heating of the bonding agent 3a.

Alternatively, the bonding layer 3 can be formed using a so-called "Die Attach Film" (DAF), which is a sheet-form resin with bonding properties. For example, the DAF may be adhered to the back face of the semiconductor wafer 2.

Figure 1B:
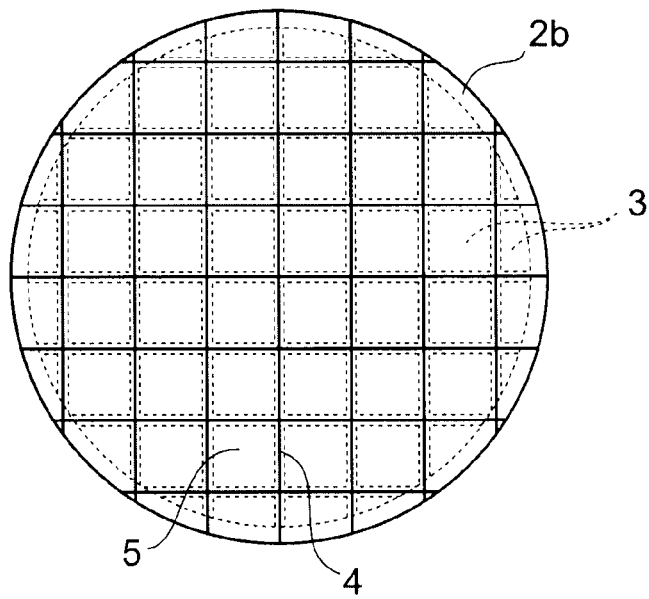

FIG. 1B is a plan view of the semiconductor wafer 2 as seen from the back face 2b, and illustrates a diced state of the semiconductor wafer 2 with the bonding layer 3 formed thereon.

A plurality of semiconductor chips 5, as demarcated by dicing lines 4, is provided on a front face 2a of the semiconductor wafer 2. Then, individual semiconductor chips 5 are separated by cutting the semiconductor wafer 2 with a dicer along the dicing lines 4 (in a process referred to below as a "dicing process").

Figure 1C:
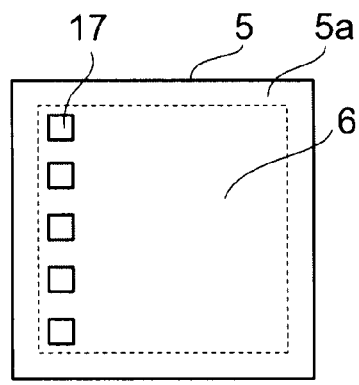
Figure 1D:
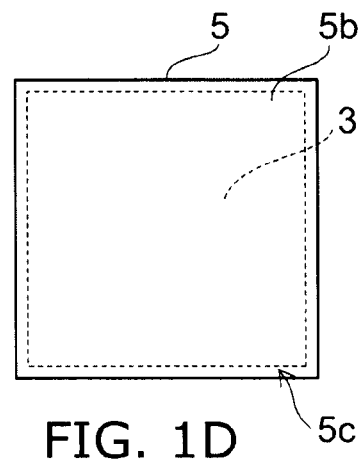

FIG. 1C is a plan view schematically illustrating a first major surface 5a of the semiconductor chip 5, and FIG. 1D is a plan view schematically illustrating a second major surface 5b of the semiconductor chip 5. The first major surface 5a of the semiconductor chip 5 corresponds to the front face 2a of the semiconductor wafer 2 and the second major surface 5b of the semiconductor chip 5 corresponds to the back face 2b of the semiconductor wafer 2.

As illustrated in FIG. 1C, an element region 6 is provided, and electrode pads 17 are disposed on the first major surface 5a of the semiconductor chip 5. Also, as illustrated in FIG. 1D, a bonding layer 3 is formed on the second major surface 5b of the semiconductor chip 5.

Here, even if the bonding agent 3a is coated over the entire back face 2b of the semiconductor wafer 2 using an ink-jet method, as illustrated in FIG. 1D, the bonding layer 3 may not always be formed on a periphery portion 5c of the semiconductor chip 5. For example, in the dicing process, the bonding layer 3 formed on the periphery portion 5c of the semiconductor chip 5 may become adhered to the dicer blade and be pulled off.

Note that the bonding layer 3 of the semiconductor chip 5 may also be formed by first performing the dicing for instance, and then using the ink-jet method on the back face of the diced wafer. In this case too, the thickness of the bonding layer 3 at chip edges and chip corner portions may be non-uniform. For example, the bonding layer 3 may be thinner or unformed at the periphery portion 5c of the semiconductor chip 5.

As described later, portions of the periphery portion 5c of the semiconductor chip 5 where the bonding layer 3 is not formed are called sink holes.

Figure 2A:
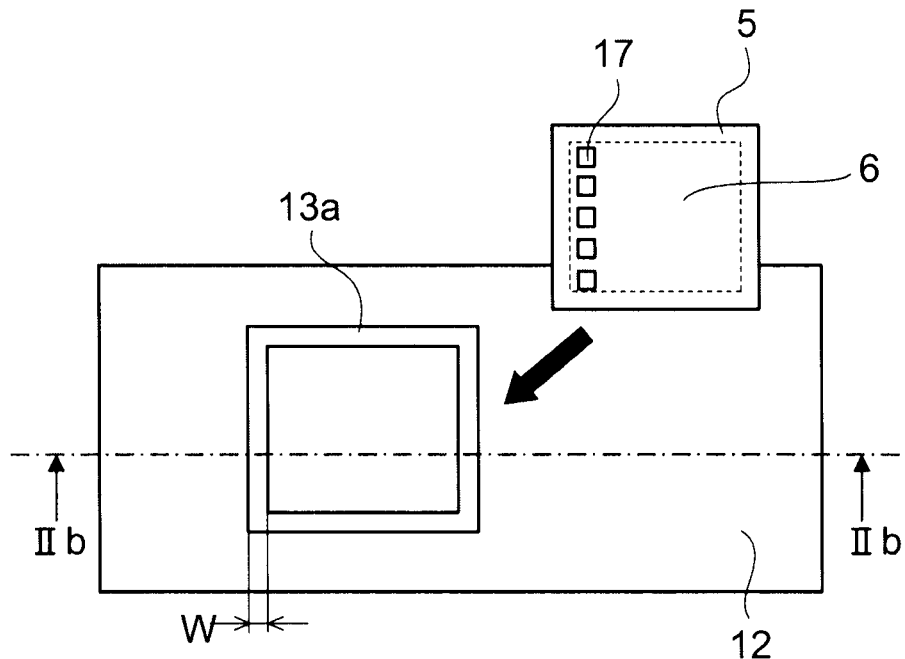
FIGS. 2A and 2B are schematic views illustrating a manufacturing process of a semiconductor device according to the first embodiment.
Figure 3A:
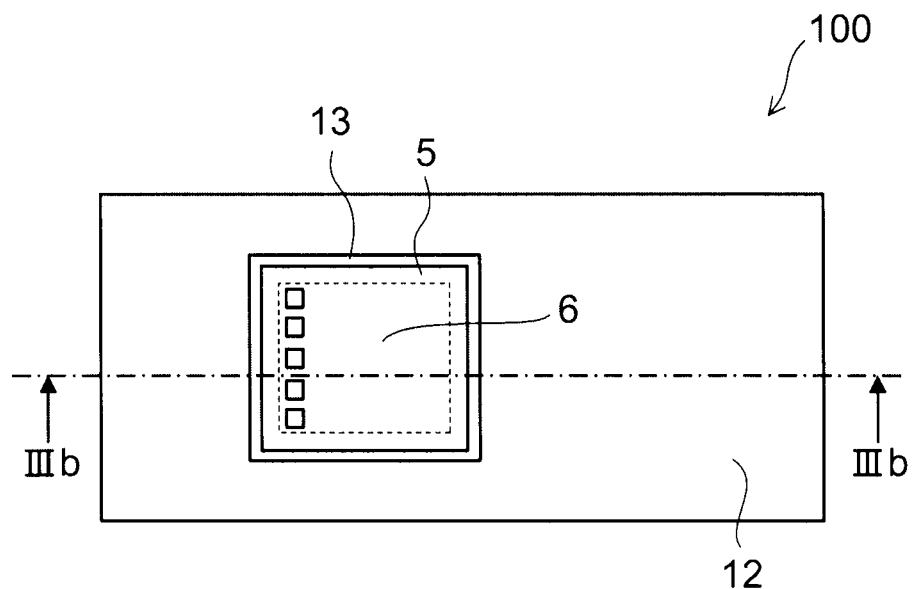
FIGS. 3A and 3B are schematic views illustrating the manufacturing process of the semiconductor device following from FIG. 2B.

FIG. 2A and FIG. 3A are schematic views illustrating a manufacturing process of a semiconductor device according to the first embodiment.

The manufacturing process of a semiconductor device 100 according to the embodiment includes, on a front face 12a of a substrate 12 for mounting the semiconductor chip 5, a process of applying a fillet-forming material 13a at a portion that is to contact an outer edge of the second major surface 5b of the semiconductor chip 5. The manufacturing process further includes a process of bonding the second major surface 5b of the semiconductor chip 5 to the substrate 12 via the bonding layer 3.

Here, "fillet" is used to mean a bonding member or the like that protrudes outwards at a joint portion of two members. For example, when the semiconductor chip 5 is bonded to the substrate 12, when the substrate 12 is viewed from above, a protruding portion of the bonding member (the fillet-forming material 13a) is formed between the second major surface 5b of the semiconductor chip 5 and the front face 12a of the substrate 12. This portion is called a fillet.

FIG. 2A illustrates a state in which the fillet forming material 13a has been applied to the front face 12a of the substrate 12. The fillet forming material 13a is applied at a portion that is to contact an outer edge of the second major surface 5b of the semiconductor chip 5. As illustrated in FIG. 2A, the fillet-forming material 13a is applied in a line along a profile of the semiconductor chip 5.

Figure 2B:
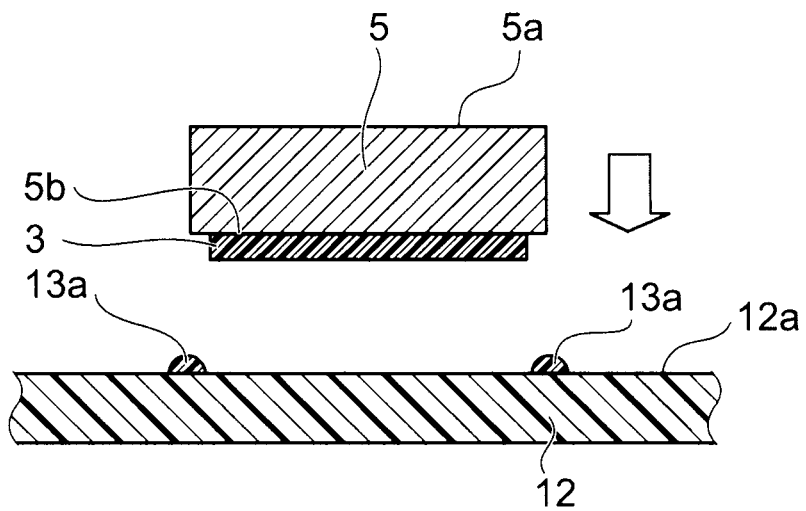

FIG. 2B illustrates a cross-section through IIb-IIb in FIG. 2A. The semiconductor chip 5 is orientated with the first major surface 5a, where the element region 6 is provided, facing upwards. The second major surface 5b side of the semiconductor chip 5, where the bonding layer 3 is provided, is bonded to the front face 12a of the substrate 12. As illustrated in FIG. 2B, the bonding layer 3 is either non-existent or formed thinly on the periphery portion 5c of the second major surface 5b.

The application of the fillet-forming material 13a may, for example, be performed using an ink-jet method. Ink-jet methods include, for instance, two methods which are a thermal method and a piezoelectric method, and either of these may be used.

In the thermal method, a liquid is jetted using a film boiling phenomenon whereby heat is applied to generate gas bubbles. In the piezoelectric method, liquid is jetted using bending displacement of a piezoelectric element. For a jet portion 10, ink-jet heads of the prior art that jet liquid using an ink-jet method may be used.

For the fillet-forming material 13a, an insulating resin diffused in a solvent may be used, for instance. The insulating resin may be a thermosetting or thermoplastic resin. From the perspective of bonding properties and heat resistant properties, a thermosetting resin such as an epoxy resin, an acrylic resin, a urethane resin, or a silicon resin may be selected.

Examples of the epoxy resin include bisphenol A epoxy resin, bisphenol F epoxy resin, novolac epoxy resin or the like. Such resins may be used alone or as a mixture including two or more different resins.

The solvent in which the insulating resin is diffused is appropriately selected to be capable of dissolving the solute resin. For example, gamma-butyrolactone (GBL), cyclohexanone, isophorone or the like may be used. Such solvents may be used alone or as a mixture including two or more different solvents. In addition, when necessary, a curing accelerator, a catalyst, a filler, a coupling agent or the like may also be added.

When an ink-jet method is used, a viscosity of the fillet-forming material 13a is reduced to suppress clogging of the jet portion 10 (see FIG. 1A). For example, the viscosity at room temperature (25° C.) may be set to not more than 0.015 Pas (value according to B-type viscosity gauge (JIS K7117-2)).

The viscosity of the fillet-forming material 13a can, for instance, be controlled using a mixture ratio of the resin and the solvent in which the resin is diffused. For example, when the epoxy resin is diffused in gamma-butyrolactone (GBL), the viscosity can be set to not more than 0.015 Pas at 25° C. by setting a proportion of the epoxy resin to 25 wt %.

Note, however, that the fillet-forming material 13a may be applied using a different method than the above-described ink-jet method, such as a dispenser method, for instance. A dispenser jets the fillet-forming material 13a in a fixed amount from a predetermined nozzle to apply to a front face of the substrate 12. The nozzle can be selected to suit the fillet-forming material 13a and application pattern.

Figure 3B:
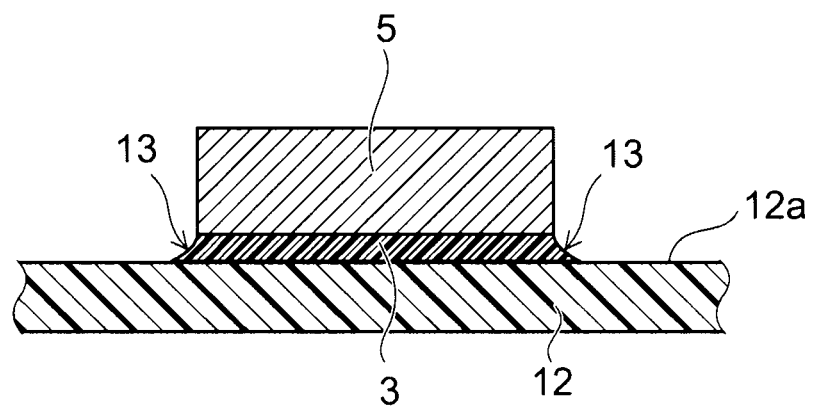

FIG. 3A illustrates a state in which the semiconductor chip is bonded to the substrate 12. FIG. 3B illustrates a cross-section through IIIb-IIIb in FIG. 3A. Here, a process of bonding the semiconductor chip 5 to the substrate 12 (processes of FIGS. 2A and 2B and FIGS. 3A and 3B) is called a die bonding process.

The viscosity of the fillet-forming material 13a applied to the front face of the substrate 12 is lower than the viscosity prior to curing of the bonding layer 3 provided on the back face of the semiconductor chip 5. Hence, when, for example, the semiconductor chip 5 is mounted on the front face 12a of the substrate 12 and pressure is applied to cause bonding, the fillet-forming material 13a contacts an outer edge of the second major surface 5b of the semiconductor chip 5, filling the periphery portion 5c to form a tight seal without gaps and with a portion squeezed outwards. Thereafter, the fillet-forming material 13a is subjected to heat treating and cured, and, as illustrated in FIG. 3A, a fillet 13 is formed along outer edges of the semiconductor chip 5.

The fillet 13 has a tapered-form, expanding from the semiconductor chip 5 towards the substrate 12. A bottom edge (substrate side) of the fillet 13 is positioned outward of the outer edge of the semiconductor chip 5. Moreover, it is desirable that a top edge (semiconductor chip side) of the fillet 13 is positioned so as to approximately match or be positioned outward of an outer edge of the second major surface 5b of the semiconductor chip 5. The sink marks (see FIG. 1D) formed at the periphery portion 5c of the second major surface 5b of the semiconductor chip 5 can be filled by the fillet 13.

It is also possible to form the top edge of the fillet 13 a small distance inward of the outer edge of the second major surface 5b of the semiconductor chip 5. If the bottom edge of the fillet 13 is positioned outward of the outer edge of the second major surface 5b of the semiconductor chip 5, a space created between the fillet 13 and the semiconductor chip 5 becomes smaller. As a result, intrusion of the sealing resin can be suppressed in comparison to when the fillet 13 is not formed.

A resin included in the fillet-forming material 13a may be identical to or of a same type as a resin included in the bonding layer 3. Accordingly, as illustrated in FIG. 3B, the bonding layer 3 and the fillet 13 can be integrally formed. As a result, separation of the bonding layer 3 from the fillet 13 can be suppressed.

Figure 7A:
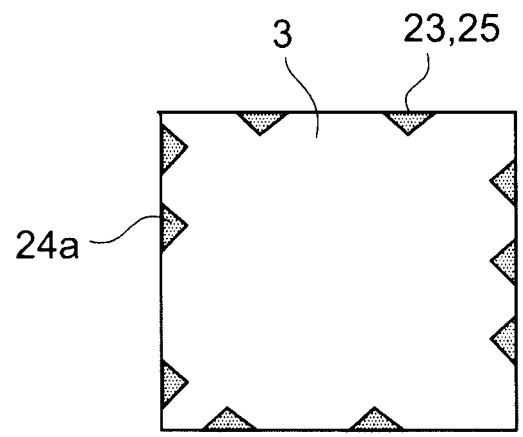
FIGS. 7A and 7B are schematic views illustrating a semiconductor device according to a comparative example.

For example, FIG. 7A illustrates a second major surface of a semiconductor chip 23 according to a comparative example. In certain cases, so-called "flaws 24a", portions where the bonding layer 3 is not formed, may be present on the second major surface of the semiconductor chip 25. The flaws 24a are caused by separation of the bonding layer 3 at dicing of the semiconductor wafer 2, flaws at outer edges of a second major surface of the semiconductor chip 23, and the like.

Figure 7B:
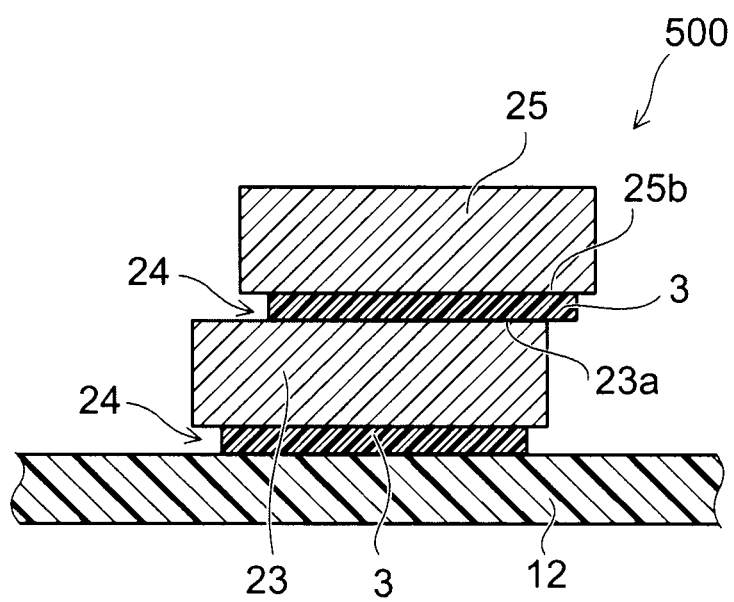

As illustrated in FIG. 7B, when the second major surface of the semiconductor chip 23 is bonded to the front face 12a of the substrate 12, sink marks 24 corresponding to the flaws 24a may be generated in an outer edge portion. The sink marks 24 are, for example, spaces corresponding to a thickness of the bonding layer 3 or a depth of the flaws 24a and, when the semiconductor chip 23 is resin-bonded onto the substrate 12, so-called "opening" may occur whereby high-pressure molding resin enters the sink marks 24 and causes the semiconductor chip 23 to separate from the substrate 12.

By contrast in the semiconductor device 100 according to the embodiment, even if the flaws 24a are formed in the second major surface 5b of the semiconductor chip 5, the fillet-forming material 13a applied to the front face 12a of the substrate 12 contacts the second major surface 5b of the semiconductor chip 5 and fills in the flaws 24a, thereby suppressing generation of the sink marks 24. As result, generation of defects such as openings can be reduced.

The flaws 24a illustrated in FIG. 7A may, for example, have a size of 0.2 mm and extend inward from the outer edge of the semiconductor chips 23 and 25. Hence, the fillet-forming material 13a applied to the front face 12a of the substrate 12 may be provided at a width W (see FIG. 2A) of approximately 0.4 mm.

Here, the bonding layer 3 can be formed with great precision in comparatively small regions using an ink-jet method. Hence, the ink-jet method is suitable as a method for applying the fillet-forming material 13a of the embodiment.

With the ink-jet method, a bonding agent with a low viscosity is applied and then heated to increase the viscosity. Thus, it is a simple matter to set the viscosity of the fillet-forming material 13a applied to the front face of the substrate 12 to be lower than the viscosity of the bonding layer 3 provided on the back face of the semiconductor chip 5.

In the ink-jet method, it is preferable that the viscosity of the bonding agent at 25° C. is set to not more than 0.015 Pas to suppress clogging of the jet nozzles at application of the bonding agent 3a. On the other hand, the bonding layer 3 immediately before the die bonding process is in the B-stage, and a viscosity of the bonding layer 3 at 150° C. is approximately 100 Pas. In other words, it is easy to set the viscosity of the fillet-forming material 13a applied to the front face of the substrate 12 to be lower than the viscosity of the bonding layer 3 provided on the back face of the semiconductor chip 5.

Moreover, if the bonding layer 3 is also formed using the ink-jet method, it is easy to use the same material for the resin included in the fillet-forming material 13a and the resin included in the bonding layer 3. This is because the viscosity desired in the bonding layer 3 and the viscosity of the fillet forming material 13a can be realized by adjusting respective heating temperatures and heating times.

Also, as illustrated in FIG. 7B, when a semiconductor chip 25 is stacked on and bonded to the semiconductor chip 23, sink marks 24 may be generated between the outer edges of the second major surface 25b of the semiconductor chip 25 and a first major surface 23a of the semiconductor chip 23. As a countermeasure, the fillet-forming material 13a may be applied to the first major surface 23a of the semiconductor chip 23, as will be described in the second embodiment.

(Second Embodiment)

FIGS. 4A and 4B and FIGS. 5A and 5B are schematic views illustrating a manufacturing process of a semiconductor device 200 according to the embodiment. The semiconductor device 200 includes a plurality of semiconductor chips, each having the element region 6 on a first major surface and the bonding layer 3 on a second major surface.

A manufacturing method of the semiconductor device 200 includes a process of applying the fillet-forming material 13a to a first major surface 15a of a first semiconductor chip (15) fixed on the substrate 12, where the plurality of semiconductor chips are to be mounted.

The fillet-forming material 13a is applied to the first major surface 15a of the semiconductor chip 15 at a portion that is to contact an outer edge of a second major surface 19b of a second semiconductor chip (19).

Moreover, the manufacturing method of the semiconductor device 200 includes a process of bonding the semiconductor chip 19 to the semiconductor chip 15 via the bonding layer 3 provided on the second major surface 19b of the semiconductor chip 19.

Figure 4A:
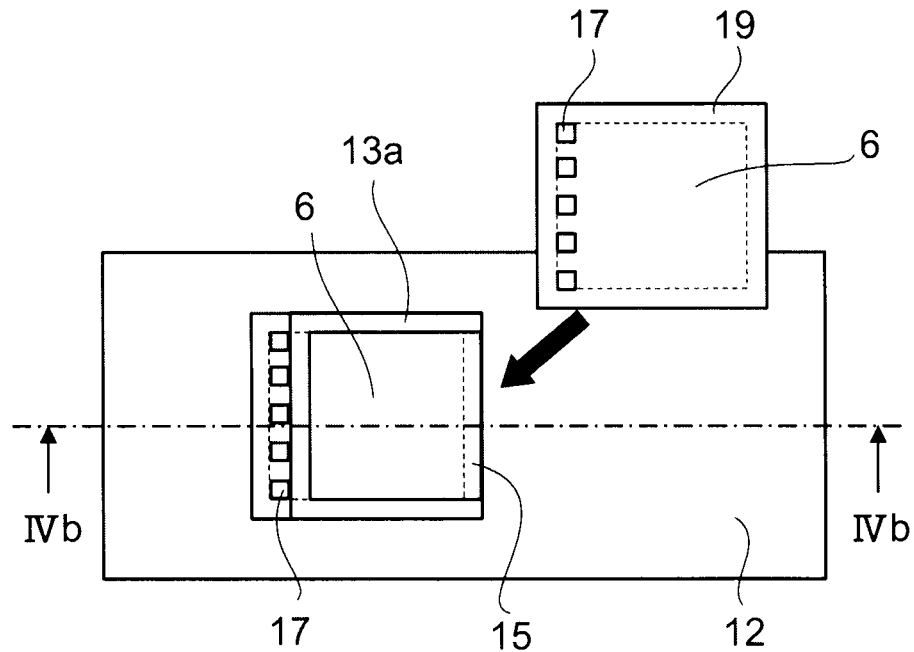
FIGS. 4A and 4B are schematic views illustrating a manufacturing process of a semiconductor device according to a second embodiment.
Figure 4B:
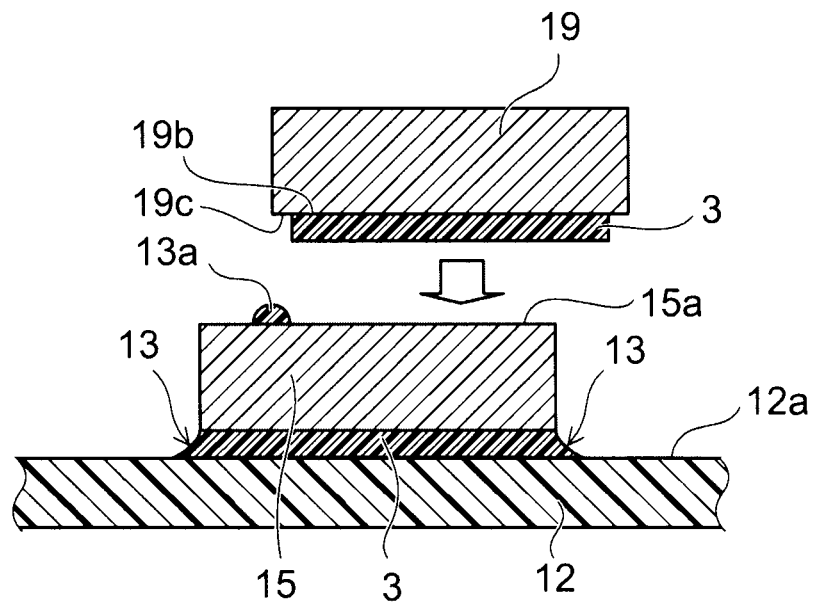

FIG. 4A illustrates a state in which the fillet-forming material 13a has been applied to the first major surface 15a of the semiconductor chip 15 that is fixed to the substrate. FIG. 4B illustrates a cross-section through IVb-IVb in FIG. 4A.

As illustrated in FIG. 4A, the semiconductor chip 15 has a plurality of electrode pads 17 provided in the element region 6. The electrode pads 17 may, for example, be disposed along one side of the element region 6 in a straight line. As illustrated in FIG. 4B, when, for example, the semiconductor chip 15 and the semiconductor chip 19 are the same size, the semiconductor chip 19 is mounted on the first major surface 15a of the semiconductor chip 15 with a shift in position so that the semiconductor chip 19 does not overlap the electrode pads 17 of the semiconductor chip 15.

For example, the semiconductor chip 19 may be mounted with a shift in a direction perpendicular (perpendicular direction) to a direction of alignment (alignment direction) of the electrode pads 17. Hence, the fillet-forming material 13a is applied on the side where the electrode pads 17 of the semiconductor chip 15 are provided, and at portions that are to contact the outer edges of the second major surface, which correspond to the two perpendicular-direction sides. In other words, the fillet-forming material 13a is applied on three of the four sides of the semiconductor chip 15.

Figure 5A:
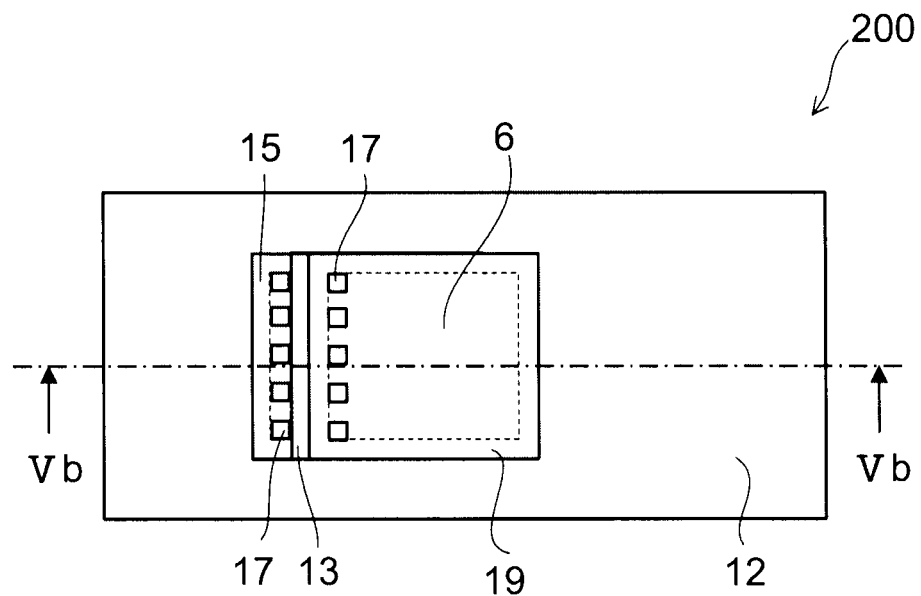
FIGS. 5A and 5B are schematic views illustrating the manufacturing process of the semiconductor device following from FIG. 4B.
Figure 5B:
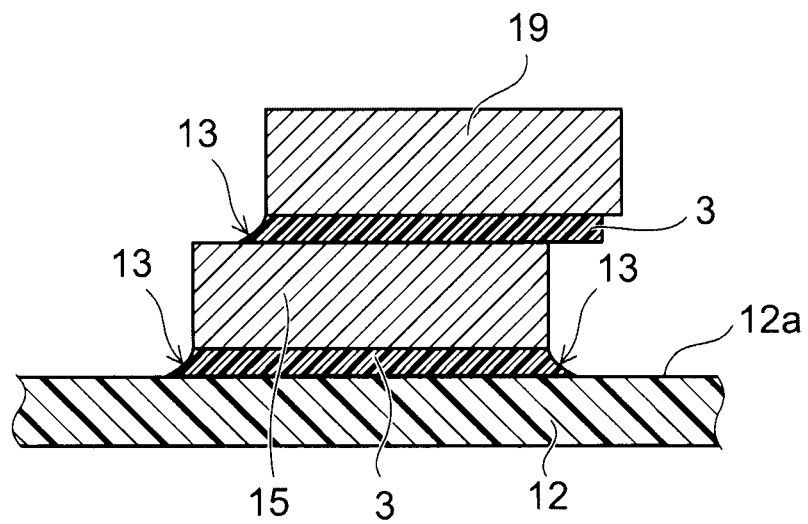

FIG. 5A illustrates a state in which the semiconductor chip 19 is bonded to a first semiconductor chip (15). FIG. 5B is a cross-section through Vb-Vb in FIG. 5A.

As illustrated in FIG. 5A, the semiconductor chip 19 is stack-mounted in a state that exposes the electrode pads 17 of the semiconductor chip 15. The fillet 13 is formed at the outer edge, along the electrode pads 17 of the second major surface of the semiconductor chip 19.

The fillet 13 has a tapered-form, widening from the semiconductor chip 19 on an upper level towards the semiconductor ship 15 on a lower level. A bottom edge (first major surface side of the semiconductor chip 15) of the fillet 13 is positioned outward of the outer edge of the second major surface 19b of the semiconductor chip 19. Moreover, it is desirable that a top edge (semiconductor chip side) of the fillet 13 is positioned so as to approximately match or be positioned outward of an outer edge of the semiconductor chip 19. The sink marks formed at a periphery portion 19c of the semiconductor chip 19 can be filled by the fillet 13.

The top edge of the fillet 13 may alternatively be positioned slightly inward of the outer edge of the semiconductor chip 19. If the bottom edge of the fillet 13 is positioned outward of the outer edge of the semiconductor chip 19, a space created between the fillet 13 and the semiconductor chip 19 becomes smaller. As a result, the probability that the Si or the like included in the sealing resin will intrude can be reduced in comparison to when the fillet 13 is not provided. In addition, damage caused to the element region 6 provided on the first major surface 15a of the semiconductor chip 15 is reduced, and deterioration of characteristics can be avoided.

The embodiment is not limited to the configuration of the two stacked semiconductor chips 15 and 19 illustrated in FIG. 5B, and another semiconductor chip may be stacked on the semiconductor chip 19 using a similar procedure.

The fillet 13 is formed so as to not to spread onto the electrode pads 17 of the semiconductor chips 15. To achieve this, an amount of shift in the semiconductor chip 19 may be increased. However, there is problem in that when the number of the stacked chips increases, the width of the stack structure including the plurality of semiconductor chips (width occupied by the semiconductor chips 15 and 19 when the substrate 12 is viewed from above) increases and a size of the semiconductor device increases.

Hence, it is preferable that the amount of shift of the semiconductor chip 19 is kept to a minimum necessary to allow exposure of the electrode pads 17 and that an application width W (see FIG. 2A) of the fillet-forming material 13a is small. For example, after taking into consideration a width of the flaws 24a of the above-described bonding layer 3, the application width W may be set at not more than 0.4 mm.

In the semiconductor device 200 in which the plurality of semiconductor chips 15 and 19 is mounted, thickness in a stacking direction thereof will increase. As a number of the stacked semiconductor chips increases, the size of the semiconductor device 200 will increase. It is therefore desirable to reduce the thickness of the semiconductor chips. Generally speaking, when semiconductor chips are processed to reduce thickness, a reduction in strength occurs and sink marks 24 are formed between the semiconductor chips, thus increasing the probability of sealing resin entering and damaging the semiconductor chips. In the semiconductor device 200 according to the embodiment, however, semiconductor chip damage is effectively prevented and miniaturization can therefore be realized.

Here, it is preferable that the electrode pads 17 of the semiconductor chip 15 on the lower level do not contact the fillet 13. This is because wires are connected to the electrode pads 17 in a subsequent wire bonding process. If the electrode pads 17 and the fillet 13 overlap, an opening region for the electrode pads 17 becomes smaller. As a result, the probability that electrical contacts cannot be made between the electrode pads 17 and the wires will increase. Hence, it is preferable to form the fillet-forming material 13a so that the bottom edge of the fillet 13 does not reach the electrode pads 17. An ink-jet method is preferable as a method to form the fillet-forming material 13a in a predetermined position with high precision as described above.

It is sufficient to form the fillet-forming material 13a in a region where the semiconductor chip 19 on the upper level and the semiconductor chip 15 on the lower level overlap, when the substrate 12 is viewed from above. Specifically, the fillet-forming material need only be formed on the lower-level semiconductor chip 15 on the side where the electrode pads 17 are provided, and at portions that are to contact the outer edges of the second major surface, which correspond to the two sides perpendicular to the side where the electrode pads 17 are provided. By using the fillet-forming material 13a on the minimum portion necessary, the overall amount of bonding agent that is used can be reduced. Thus, an ink-jet method is preferable as a method to form the fillet-forming material 13a in a predetermined position with high precision as described above.

It is extremely unlikely that sink marks will be generated on the side opposite the side where the electrode pads 17 of the semiconductor chip 19 are provided. This is because the semiconductor chip 19 on the upper level has been shifted towards the side that is opposite the electrode pads 17, and the peripheral portion 19c of the semiconductor chip 19 on the upper level is not located on an edge part of the semiconductor chip 15 of the lower level. Thus, there is no need to form the fillet 13 on the lower-level semiconductor chip 15 side that is opposite the side where the electrode pads 17 are provided. As a result, by using the fillet-forming material 13a on the minimum portion necessary, the overall amount of bonding agent used can be reduced.

Figure 6A:
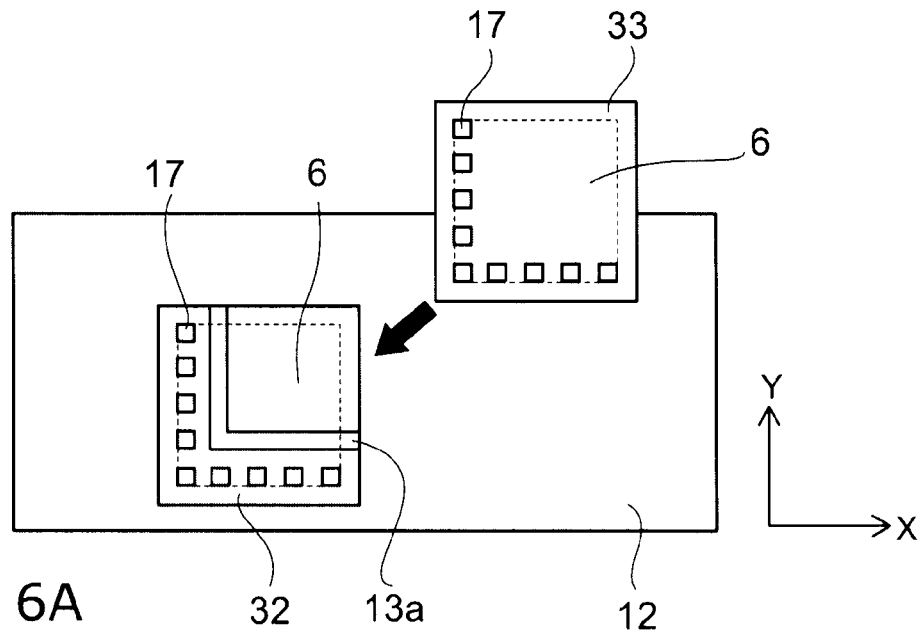
FIGS. 6A and 6B are schematic plan views illustrating a manufacturing process of a semiconductor device according to a variation of the second embodiment.
Figure 6B:
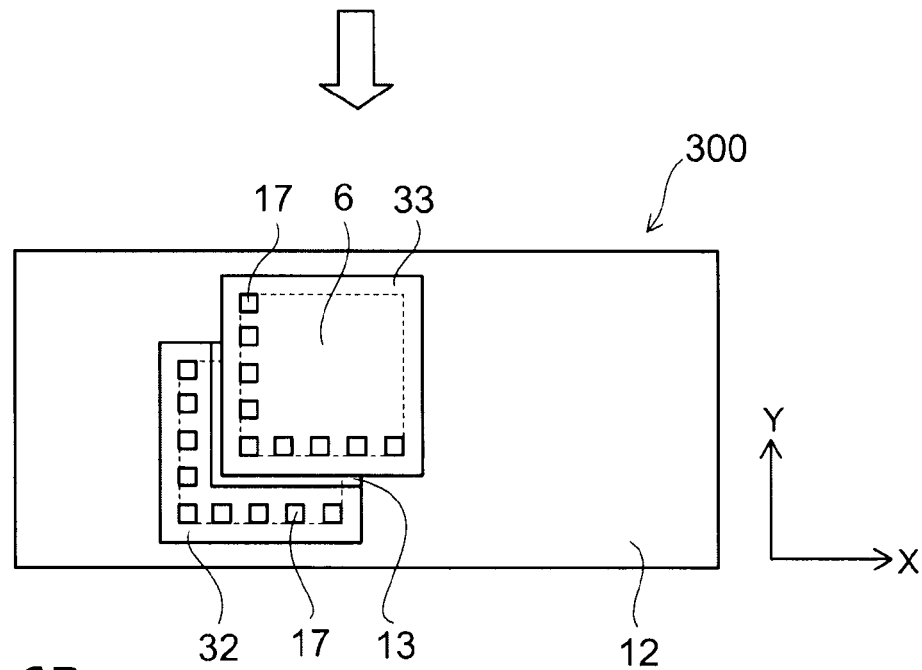

FIGS. 6A and 6B are plan views schematically illustrating a manufacturing process of a semiconductor device 300 according to a variation of the second embodiment. FIG. 6A illustrates a state in which the fillet-forming material 13a has been applied to a first major surface of a first semiconductor chip (32) that is fixed to a substrate, and FIG. 6B illustrates a state in which a second semiconductor chip (33) has been bonded to the first major surface of the first semiconductor chip (32).

As illustrated in FIG. 6A, the semiconductor chips 32 and 33 mounted in the semiconductor device 300 are each provided with a plurality of the electrode pads 17 along two sides adjacent to the element region 6. Hence, as illustrated in FIG. 6B, the semiconductor chip 33 is mounted so as to be shifted diagonally with respect to the first major surface of the semiconductor chip 32, thereby exposing the electrode pads 17 provided along the two sides of the element region 6 of the semiconductor chip 32. In other words, if an X direction is set as a horizontal direction on paper and a Y direction is set as the vertical direction on paper, the semiconductor chip 33 can be said to be shifted in both the X direction and the Y direction.

In a manufacturing method according to the variation, the fillet-forming material 13a is applied on the first major surface of the semiconductor chip 32. The fillet-forming material 13a is applied to portions that are to contact the outer edges of the second major surface, which correspond to the two sides of the side of the semiconductor chip 33 where the electrode pads 17 are provided. Thereafter, the fillet 13 is formed along an outer edge of the second major surface of the semiconductor chip 33.

In the semiconductor devices 200 and 300 according to the embodiment, the fillet-forming material 13a is applied to the first major surface of the first semiconductor chip. The second semiconductor chip is then bonded to the first semiconductor chip with the outer edges of the second major surface of the second semiconductor chip contacting the fillet-forming material 13a. The fillet 13 is then formed along the outer edges of the second major surface of the second semiconductor chip.

The fillet 13 bonds tightly, filling the sink marks of a peripheral portion of the second major surface of the second semiconductor chip. As illustrated in FIG. 7A, even when, for example, there are flaws 24a in the bonding layer 3 on the second major surface 25b of the semiconductor chip 25, the generation of sink marks 24 between the first major surface 23a of the semiconductor chip 23 and the second major surface 25b of the semiconductor chip 25 illustrated in FIG. 7B can be suppressed. Consequently, damage to the element region 6 caused by high-pressure resin at molding and opening between the first semiconductor chip and the second semiconductor chip can be reduced. Moreover, entering of foreign matter such as Si or the like included in the sealing resin into the sink marks 24 can be prevented from becoming a factor in the deterioration of the characteristics of the semiconductor chip.

In the embodiment too, the fillet-forming material 13a can be applied using an injection method or a dispenser method. The fillet-forming material 13a may, for example, include an insulating resin, and a resin that is identical to or of the same type as a resin included in the bonding layer 3 may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device including a semiconductor chip having a first major surface, a second major surface opposite to the first major surface, and electrode pads formed on the first major surface, the method comprising:
   forming a bonding layer provided on a second major surface of the semiconductor chip;
   applying a fillet-forming material on a substrate so that the fillet-forming material contacts an outer edge of the second major surface of the semiconductor chip when bonding the semiconductor chip to the substrate; and
   after forming the bonding layer and after applying the fillet-forming material, bonding the semiconductor chip to the substrate via the bonding layer and the fillet-forming material;
   wherein, in the bonding the semiconductor chip, a viscosity of the fillet-forming material is lower than a viscosity of the bonding layer prior to curing.

2. The method according to claim 1, further comprising curing the fillet-forming material to form a fillet,
   the fillet being provided in a form expanding from the semiconductor chip towards the substrate, and
   an edge of the fillet on a side of the substrate being positioned outside an outer edge of the semiconductor chip.

3. The method according to claim 2, wherein an edge of the fillet on a side of the semiconductor chip is positioned outside the outer edge of the semiconductor chip.

4. The method according to claim 1, wherein the applying the fillet-forming material is performed using an ink jet method or a dispenser method.

5. The method according to claim 1, wherein a viscosity of the fillet-forming material at room temperature is not more than 0.015 Pa·s.

6. The method according to claim 1, wherein the fillet-forming material is a thermosetting resin diffused in a solvent.

7. The method according to claim 6, wherein the thermosetting resin is one of an epoxy resin, an acrylic resin, a urethane resin, and a silicon resin.

8. The method according to claim 6, wherein the solvent is one of gamma-butyrolactone (GBL), cyclohexanone, and isophorone.

9. The method according to claim 1, wherein the fillet forming material is a thermoplastic resin diffused in a solvent.

10. A method for manufacturing a semiconductor device including a semiconductor chip having a first major surface, a second major surface opposite to the first major surface, and electrode pads formed on the first major surface, the method comprising:
    forming a bonding layer provided on a second major surface of the semiconductor chip;
    applying a fillet-forming material on a substrate so that the fillet-forming material contacts an outer edge of the second major surface of the semiconductor chip when bonding the semiconductor chip to the substrate, wherein a resin contained in the fillet-forming material is identical to or of a same type as a resin included in the bonding layer; and
    after forming the bonding layer and after applying the fillet-forming material, bonding the semiconductor chip to the substrate via the bonding layer and the fillet-forming material.

11. A method for manufacturing a semiconductor device including a semiconductor chip having a first major surface, a second major surface opposite to the first major surface, and electrode pads formed on the first major surface, the method comprising:
    forming a bonding layer provided on a second major surface of the semiconductor chip, wherein the bonding layer is a Die Attach Film (DAF);
    applying a fillet-forming material on a substrate so that the fillet-forming material contacts an outer edge of the second major surface of the semiconductor chip when bonding the semiconductor chip to the substrate; and
    after forming the bonding layer and after applying the fillet-forming material, bonding the semiconductor chip to the substrate via the bonding layer and the fillet-forming material.

12. A method for manufacturing a semiconductor device including a first semiconductor chip and a second semiconductor chip provided on the first semiconductor chip, each semiconductor chip having a first major surface, a second major surface opposite to the first major surface, and a plurality of electrode pads formed on the first major surface, the method comprising:
    forming a bonding layer on a second major surface of a second semiconductor chip;
    applying a fillet-forming material on a first major surface of the first semiconductor chip fixed on a substrate so that the fillet-forming material contacts an outer edge of a second major surface of the second semiconductor chip when bonding the second semiconductor chip to the first semiconductor chip; and bonding the second semiconductor chip to the first semiconductor chip via a bonding layer of the second semiconductor chip and the fillet-forming material.

13. The method according to claim 12, wherein the plurality of electrode pads formed on the first semiconductor chip are disposed along one or two sides of the first semiconductor chip, and the fillet-forming material applied to the first major surface of the first semiconductor chip is configured not to overlap with the plurality of electrode pads.

14. The method according to claim 12, further comprising curing the fillet-forming material to form a fillet, the fillet being provided in a form expanding from the second semiconductor chip towards the substrate, and an edge of the fillet on a side of the first semiconductor chip being positioned outside an outer edge of the second semiconductor chip.

15. The method according to claim 14, wherein an edge of the fillet on a side of the second semiconductor chip is positioned outside the outer edge of the second semiconductor chip.

16. The method according to claim 14, wherein in the bonding the semiconductor chips, a viscosity of the fillet-forming material is lower than a viscosity of the bonding layer prior to curing.

17. The method according to claim 13, wherein the fillet-forming material is a thermosetting resin diffused in a solvent.

18. The method according to claim 13, wherein a resin contained in the fillet-forming material is identical to or of a same type as the resin included in the bonding layer.

19. The method according to claim 13, wherein the applying the fillet-forming material is performed using an ink jet method or a dispenser method.

* * * * *